(12) United States Patent
Chen et al.

(10) Patent No.: US 6,207,546 B1
(45) Date of Patent: Mar. 27, 2001

(54) PREVENT PASSIVATION FROM KEYHOLE DAMAGE AND RESIST EXTRUSION BY A CROSSLINKING MECHANISM

(75) Inventors: Shih-Shiung Chen, Hsin-chu; Mingchu King, Taichung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/144,823

(22) Filed: Aug. 28, 1998

(51) Int. Cl.$^7$ ................................................ H01L 21/44
(52) U.S. Cl. ..................... 438/612; 438/725; 438/945; 438/626; 430/313; 430/317
(58) Field of Search ................................ 438/612, 949, 438/948, 945, 725, 623, 624, 626; 430/313, 317

(56) References Cited

U.S. PATENT DOCUMENTS

| | | | |
|---|---|---|---|
| 4,649,099 | * 3/1987 | Oguchi | 430/323 |
| 4,794,021 | 12/1988 | Potter | 427/240 |
| 5,077,234 | 12/1991 | Scoopo et al. | 437/67 |
| 5,494,853 | 2/1996 | Lur | 437/195 |
| 5,506,173 | * 4/1996 | Nishimoto | 438/780 |

* cited by examiner

*Primary Examiner*—Caridad Everhart
(74) *Attorney, Agent, or Firm*—George O. Saile; Stephen B. Ackerman; Rosemary L.S. Pike

(57) ABSTRACT

A new method of preventing passivation keyhole damage and resist extrusion by a resist crosslinking mechanism is described. Semiconductor device structures are formed in and on a semiconductor substrate and covered by an insulating layer. Metal lines are formed overlying the insulating layer wherein there is a gap between two of the metal lines. A passivation layer is deposited overlying the metal lines. A negative tone photoresist material is coated over the passivation layer. The photoresist is exposed to light through a mask wherein the mask is clear overlying the metal lines in an active area and wherein the mask is opaque overlying a metal line in a bonding pad area where a bonding pad is to be formed. The portion of the negative tone photoresist underlying the clear mask is exposed to light whereby crosslinks are formed within the exposed photoresist and wherein the portion of the photoresist underlying the opaque mask is unexposed. The photoresist is developed wherein the unexposed photoresist is removed leaving the exposed photoresist as an etching mask. The passivation layer is etched away where it is not covered by the etching mask where the bonding pad is to be formed wherein the crosslinked photoresist protects the underlying passivation layer from etching damage.

16 Claims, 6 Drawing Sheets

PREVENT PASSIVATION FROM KEYHOLE DAMAGE AND RESIST EXTRUSION BY A CROSSLINKING MECHANISM

BACKGROUND OF THE INVENTION (1) Field of the Invention

The invention relates to a method of preventing etching damage to a passivation layer in the fabrication of integrated circuits, and more particularly, to a method of preventing etching damage to a passivation layer by crosslinking a negative resist in the manufacture of integrated circuits.

(2) Description of the Prior Art

The manufacture of integrated circuit devices has progressed to the point where half micron and sub-half micron feature sizes are common. In this technology, the top metal spacing becomes narrow enough so that keyholes are formed within the silicon oxide/silicon nitride layers covering the metal lines for certain geometrical patterns, such as at the turning points of a group of parallel metal lines.

For example, FIG. 1 illustrates a semiconductor substrate 10. Layer 14 contains various semiconductor device structures and insulating layers, not shown. The topmost metal layer 20 is shown overlying layer 14. Typically, the metal layer is passivated by first depositing a layer of silicon oxide 22 by plasma enhanced chemical vapor deposition (PECVD). Then, a silicon nitride layer 24 is deposited also by PECVD. Because the gap between the metal lines is so small, a keyhole 25 can form within the gap.

After the passivation layer has been deposited, a layer of photoresist is coated over the passivation layer and the layer is patterned as desired. However, when the photoresist 30 is coated over a layer containing keyholes, the resist will flow into the keyholes resulting in a thinner resist layer in these areas, as shown in FIG. 2. During the plasma etching process, a portion of the photoresist mask will be eroded away. Because of the thinner resist in the areas of the keyholes, the passivation layer in those areas may be exposed by the eroding of the photoresist causing damage in the device areas.

After the etching step, the photoresist mask is stripped. This is typically done by a wet strip followed by $O_2$ plasma ashing. As illustrated in FIG. 3, the photoresist 31 within the keyhole may harden so that it cannot be removed by the photoresist strip. Wet chemicals 33 from the wet strip may be trapped around the hardened photoresist 31. Hard baking both before and during the plasma etch and $O_2$ plasma etching all are performed at high temperatures which can cause the resist to harden.

The wafer is then annealed in hydrogen and nitrogen at between about 400 to 450° C. This alloy process provides $H_2$ at a relatively high temperature to react with the silicon dangling bonds to stabilize the $SiO_2$—Si interface. The alloy process is used to release trapped interface charges from the plasma processes, including etching, depositing, and ashing. During this annealing, the hardened photoresist 31 may be extruded from the keyhole. The wet chemicals 33 previously trapped by the photoresist 31 would evaporate and cause defects to the device.

The most common solution to this problem is to planarize the passivation layer by covering it with a spin-on-glass layer or a silicon oxide layer deposited by subatmospheric chemical vapor deposition (SACVD) and then etching back. Then, the photoresist is coated onto the planarized layer. However, this method changes the passivation film structure requiring further device reliability qualification and dramatically increased production costs.

U.S. Pat. No. 5,494,853 to Lur discloses a method of metal patterning, including metal islands and dummy vias, that will prevent openings to tunnels and holes within a passivation layer and thereby prevent a photoresist coating from sinking into the holes. U.S. Pat. No. 5,007,234 to Scoopo et al teaches a planarization process utilizing three resist layers. U.S. Pat. No. 4,794,021 to Potter discloses a photoresist reflow technique to form a uniform thick photoresist coating. A much less complicated and costly method for solving the resist thinning problem over keyholes is desired.

SUMMARY OF THE INVENTION

A principal object of the present invention is to provide an effective and very manufacturable method of forming a passivation layer in the manufacture of an integrated circuit device.

A further object of the invention is to provide a method for preventing passivation damage caused by keyholes in the fabrication of integrated circuits.

A still further object of the invention is to provide a method for preventing passivation keyhole damage and resist extrusion in the fabrication of integrated circuits.

Yet another object is to provide a method for preventing passivation keyholes damage and resist extrusion by a resist crosslinking mechanism.

In accordance with the objects of this invention a new method of preventing passivation keyhole damage and resist extrusion by a resist crosslinking mechanism is achieved. Semiconductor device structures are formed in and on a semiconductor substrate and covered by an insulating layer. Metal lines are formed overlying the insulating layer wherein there is a gap between two of the metal lines. A passivation layer is deposited overlying the metal lines. A negative tone photoresist material is coated over the passivation layer. The photoresist is exposed to light through a mask wherein the mask is clear overlying the metal lines in an active area and wherein the mask is opaque overlying a metal line in a bonding pad area where a bonding pad is to be formed. The portion of the negative tone photoresist underlying the clear mask is exposed to light whereby crosslinks are formed within the exposed photoresist and wherein the portion of the photoresist underlying the opaque mask is unexposed. The photoresist is developed wherein the unexposed photoresist is removed leaving the exposed photoresist as an etching mask. The passivation layer is etched away where it is not covered by the etching mask where the bonding pad is to be formed wherein the crosslinked photoresist protects the underlying passivation layer from etching damage.

BRIEF DESCRIPTION OF THE DRAWINGS

In the accompanying drawings forming a material part of this description, there is shown.

DESCRIPTION OF THE PREFERRED EMBODIMENTS

Figure 4:
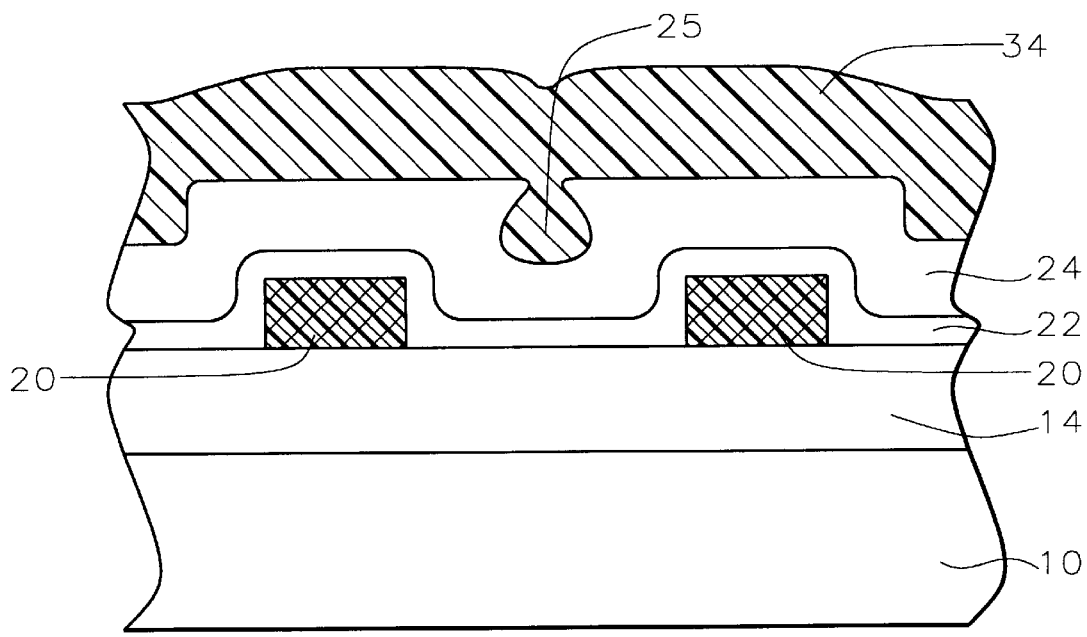
FIGS. 4 through 10 schematically illustrate in cross-sectional representation a preferred embodiment of the present invention.

Referring now more particularly to FIG. 4, there is illustrated a portion of a partially completed integrated circuit device. There is shown a semiconductor substrate 10, preferably composed of monocrystalline silicon. Semiconductor device structures are formed in and on the semiconductor substrate, as is conventional in the art. These structures may include gate electrodes and interconnection lines on the surface of the substrate and source and drain regions within the substrate. Active areas of the substrate are separated from one another by isolation regions, such as field oxide regions or shallow trench isolation. Multiple metal layers may be formed with electrical connections through openings in insulating layers separating the metal layers. All of these semiconductor device structures are formed conventionally and are represented by layer 14 in FIG. 4.

The topmost patterned metal layer is illustrated by metal lines 20. A passivation layer is now to be formed overlying the topmost metal layer. Typically, this consists of a first conformal layer of silicon oxide 22 deposited by plasma enhanced chemical vapor deposition (PECVD) followed by a gap-filling layer of silicon nitride 24 also deposited by PECVD.

Because of the narrow spacing between the metal lines for small geometries, the silicon nitride layer 24 cannot completely fill the gaps between the metal lines. The gaps between the metal lines are between about 0.7 and 1.0 micron in width. A keyhole 25 may form in the passivation layer.

Figure 1:
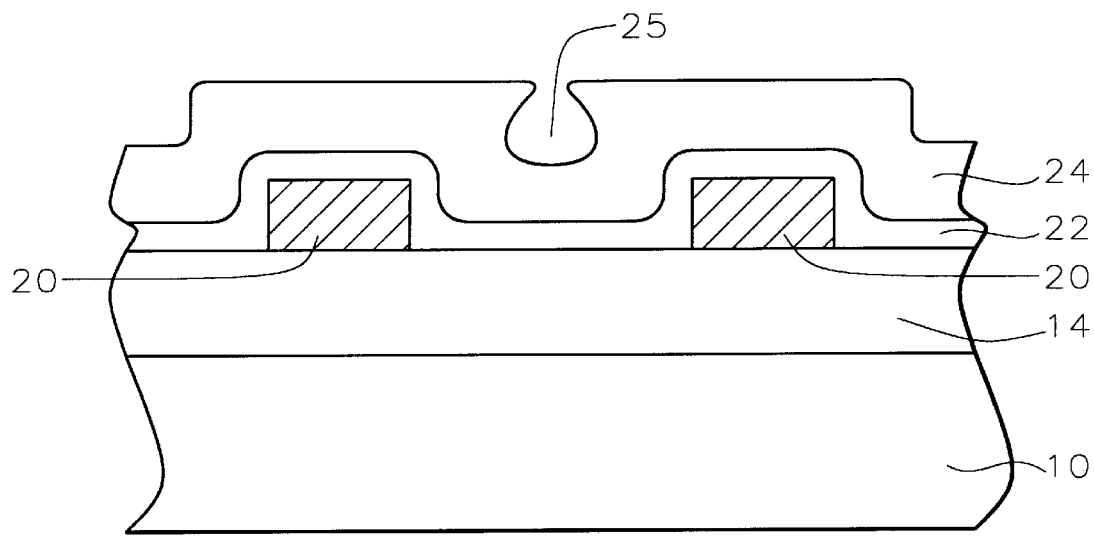
FIGS. 1 through 3 schematically illustrate in cross-sectional representation an embodiment of the prior art.
Figure 2:
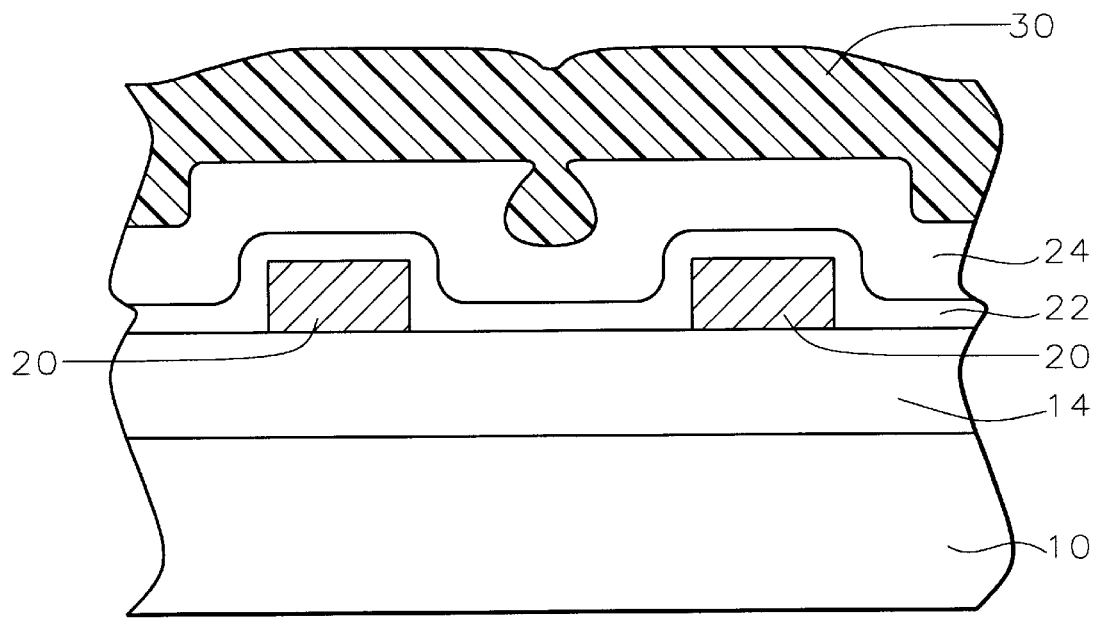
Figure 3:
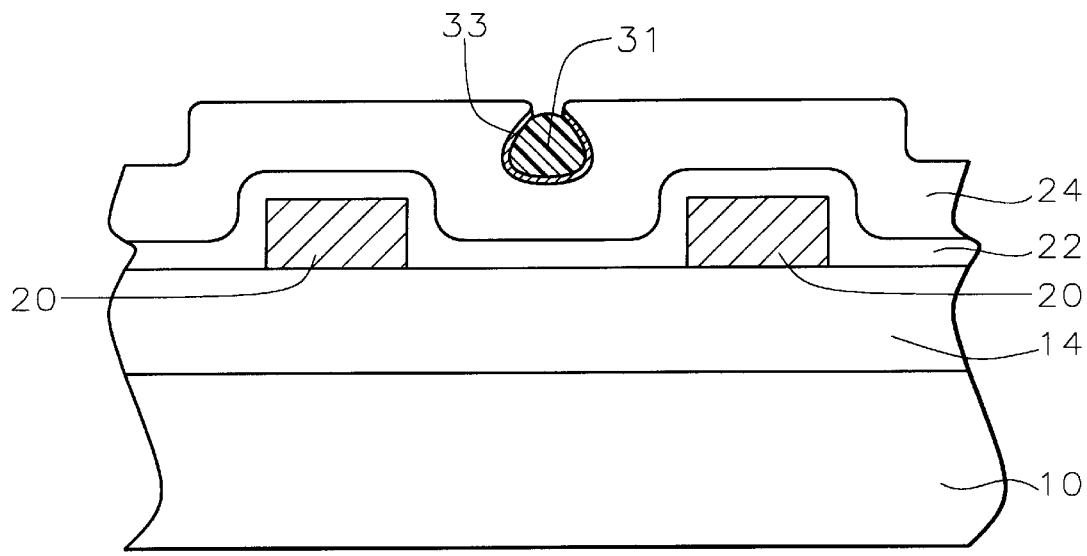

As discussed above with reference to FIG. 2, photoresist coated onto the passivation layer will sink into the keyholes causing resist thinning in these areas. The process of the present invention prevents this resist thinning by a simple and inexpensive process.

Normally, a positive photoresist material is used in the industry. However, in the process of the present invention, a negative tone photoresist material 34 is coated over the passivation layer.

In the photolithography process, a mask is placed over the photoresist material. The mask is clear in places where the photoresist material is to be exposed to the light and opaque where the material is not to be exposed. When a positive photoresist material is used, the photoresist material exposed to light degrades and decomposes. A developer solution is used to remove the decomposed photoresist material leaving the unexposed photoresist material behind. In the case of negative photoresist material, light exposure cross-links the polymer within the photoresist material so that it cannot be dissolved by the developer. The developer solution removes the unexposed photoresist material. In choosing a negative photoresist material, thickness, photospeed, resolution, and erosion rate are concerns. The negative photoresist material NFR-014 by Japan Synthetic Rubber Co, Ltd. is preferred.

Figure 5:
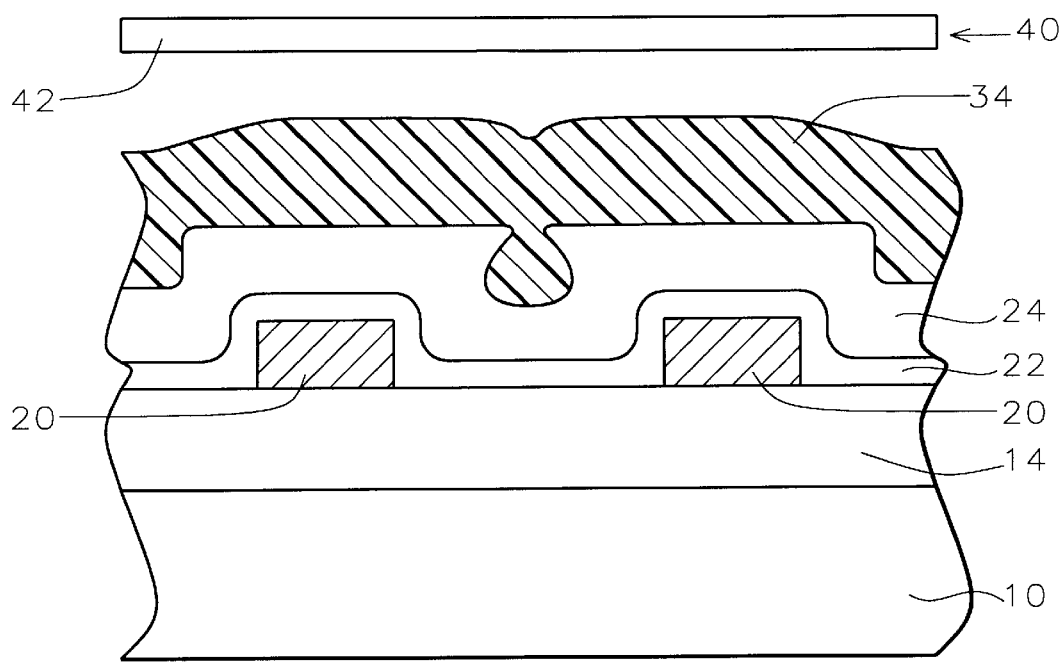
Figure 6:
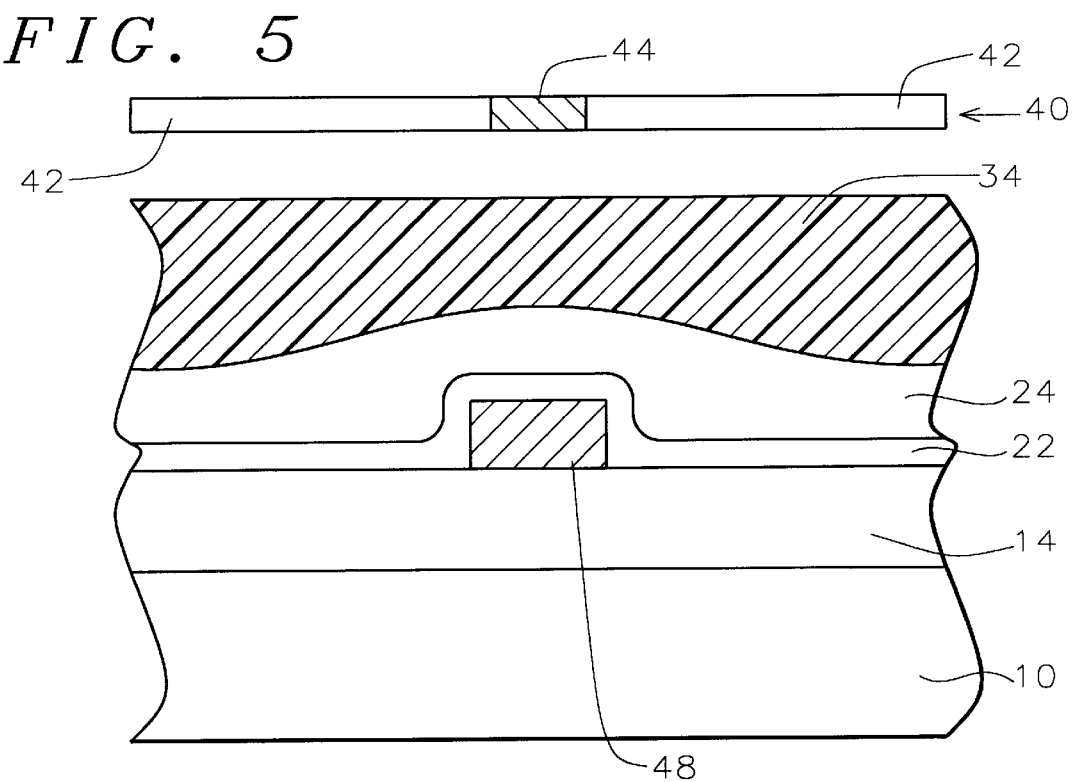

Referring to FIG. 5, the negative tone photoresist 34 is coated over the passivation layer to a thickness of between about 25,800 and 26,200 Angstroms. A reversed tone passivation mask 40 is used over the substrate. In the device area, as illustrated in FIG. 5, the mask is clear 42. In the bonding pad area, illustrated in FIG. 6, portions of the mask under which openings are desired are opaque 44. The metal bonding pad 48, shown in FIG. 6, will form the bonding pad.

Figure 8:
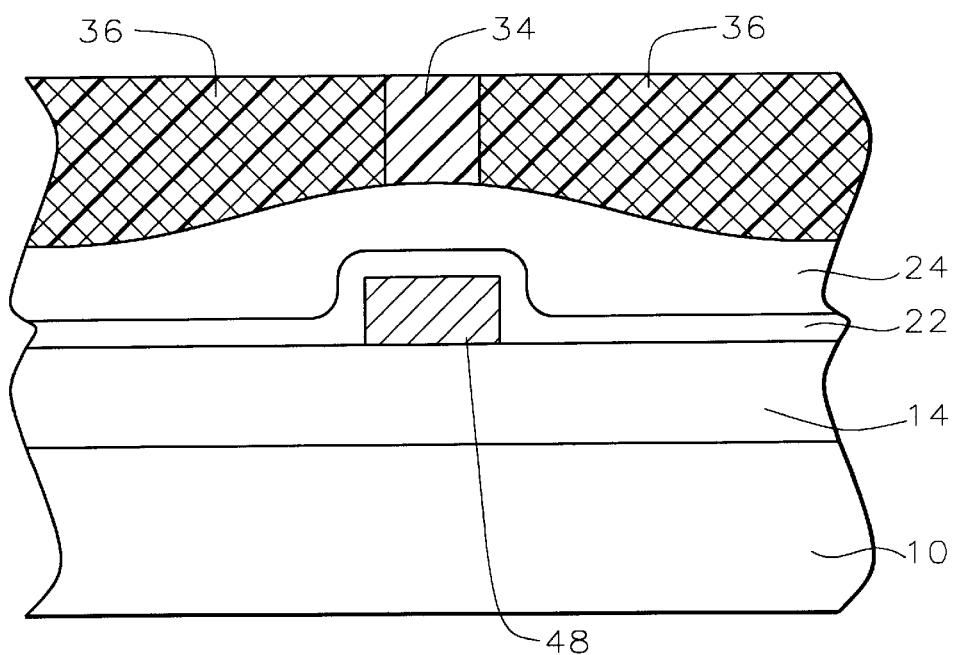
Figure 9:
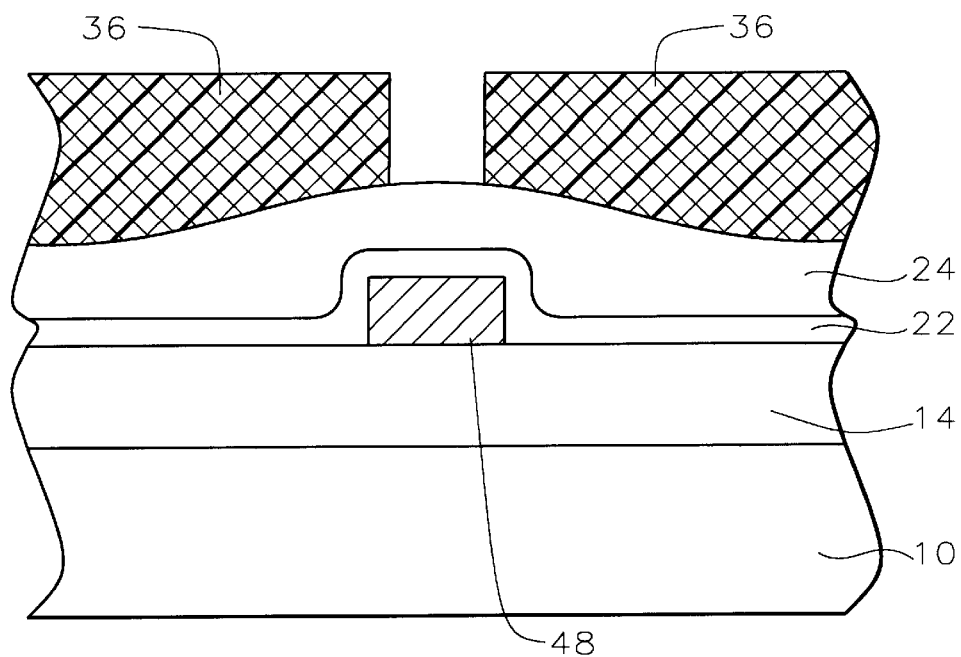

The photoresist material 34 is exposed to light through the mask 40. Where the mask is clear (42) the photoresist material is exposed to the light. The light exposure causes the polymer to form crosslinks, as illustrated by 36 in FIGS. 7 and 8 in the device area and bonding pad area, respectively. A developer solution is now applied to remove the unexposed photoresist material 34, as illustrated in FIG. 9. None of the photoresist material is removed in FIG. 7. A Tetramethyl ammonia hydroxide (TMAH)-based developer is preferred. NMD-W, available from Tokyo Ohka Kogyo Co. Ltd. is recommended.

The crosslinked resist remaining has a very low erosion rate for etching, only about 100 Angstroms per minute. In contrast, the erosion rate of a positive photoresist is nearly 10,000 Angstroms/minute.

The crosslinked resist will prevent keyhole etching damage. The rigid crosslinked resist structure within the keyhole also will prevent extrusion of the resist during alloying. The rigid crosslinked polymer will cause solvents to swell, but not to dissolve. As a result, during alloying at 400 to 450° C., the rapidly evaporated solvent molecules cannot extrude the rigid polymer out of the keyhole.

Figure 10:
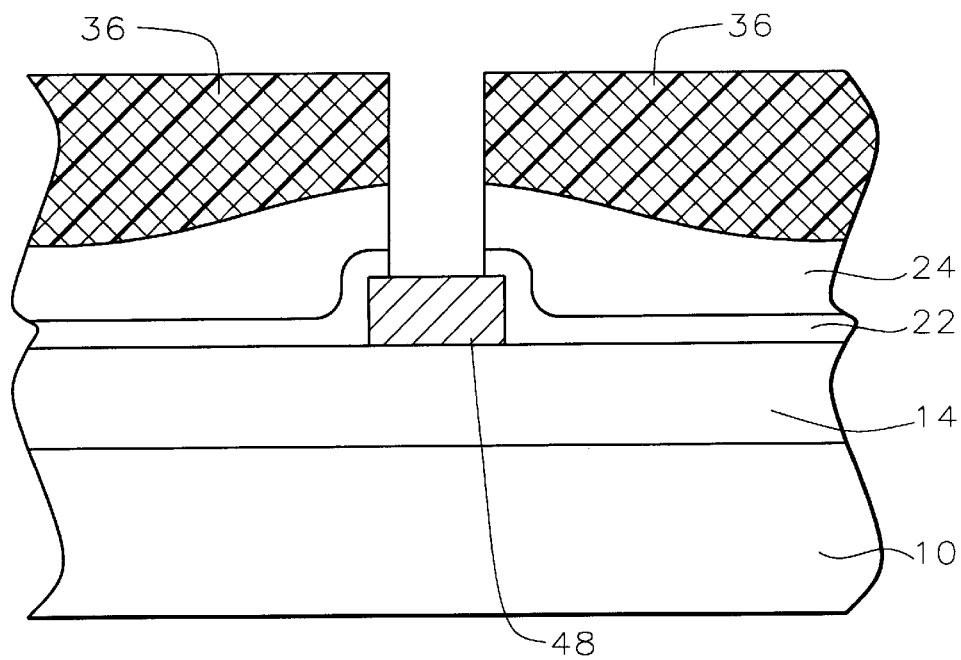

Referring now to FIG. 10, the passivation layer is etched away where it is not covered by the photoresist mask 36 to provide an opening to the metal bonding pad 48.

The crosslinked photoresist mask is stripped away, for example, using a wet chemical strip followed by $O_2$ plasma ashing. ACT-195 by Ashland Chemical Co. Ltd. is the recommended resist stripper.

No further planarization is required. The process of the present invention provides a simple and effective method of preventing keyhole damage and resist extrusion by using the crosslinking properties of negative photoresist.

Figure 7:
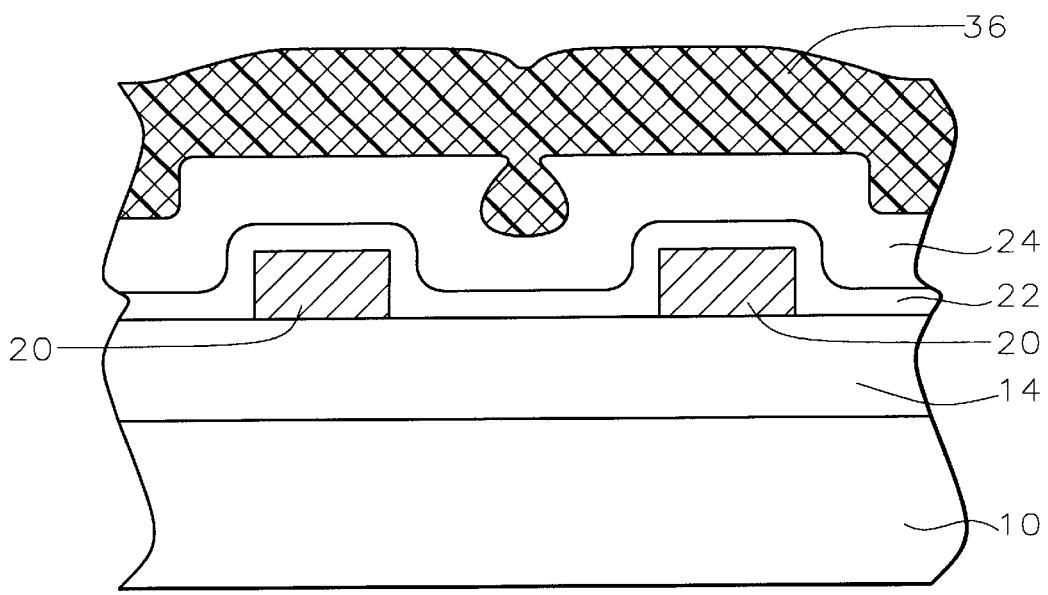
Figure 11:
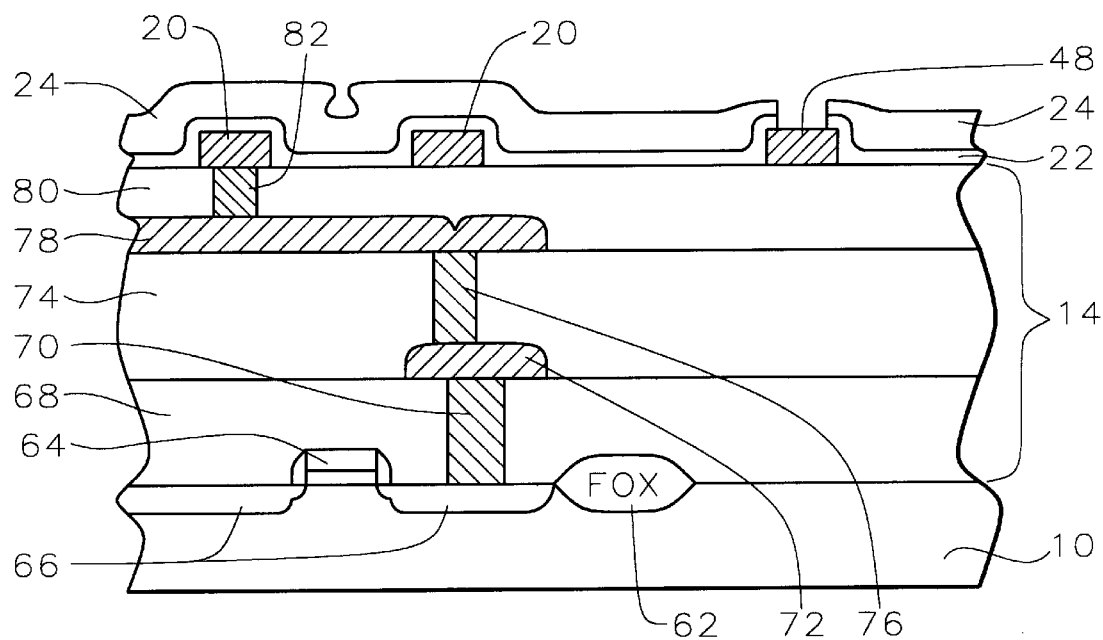
FIG. 11 schematically illustrates in cross-sectional representation a completed integrated circuit device fabricated using the process of the present invention.

FIG. 11 illustrates an example of a completed integrated circuit device fabricated according to the process of the present invention. Layer 14 in the previous figures has been expanded to show an example of the types of layers that may be formed within layer 14. For example, Field OXide region 62 has been formed to separate a device area on the left of the figure (as illustrated in FIGS. 4, 5, and 7) from the bonding pad area on the right side of the figure, as illustrated in FIGS. 6 and 8–10. In the device area, gate electrode 64 has been fabricated on the surface of the semiconductor substrate 10. Associated source and drain regions 66 have been formed adjacent to the gate within the semiconductor substrate. A first metal plug 70 has been deposited into an opening through an insulating layer 68 to one of the source and drain regions 66. Metal layer 72 forms the patterned metal layer. An intermetal dielectric layer 74 has been deposited over the first metal layer 72. A second metal plug 76 and second metal layer 78 have been deposited and patterned to make electrical connection to the first metal layer through an opening in the intermetal dielectric layer 74. A second intermetal dielectric layer 80 has been deposited over the second metal layer 78. Third metal plug 82 is formed through an opening in the dielectric layer 80. Finally, the third metal layer is deposited and patterned to form metal lines 20 and metal bonding pad 48. The passivation layer 22/24 is deposited and patterned as described with reference to FIGS. 4–10 using the process of the present invention.

It will be understood by those skilled in the art that FIG. 11 illustrates only one example of the final structure of an integrated circuit device. Any number of metal layers or other conducting layers such as polysilicon or other materials and intervening interlevel dielectric layers may be formed in and on the semiconductor substrate. The process of the present invention for preventing keyhole damage and resist extrusion of the passivation layer over the topmost conducting layer can be used in fabricating any integrated circuit device, including, but not limited to, the example shown in FIG. 11.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

depositing a passivation layer overlying said metal lines wherein a keyhole is formed within said passivation layer within said gap;

coating said passivation layer with a negative tone photoresist material wherein said photoresist material flows into said keyhole;

exposing said negative tone photoresist to light through a mask wherein said mask is clear overlying said metal lines in an active area and wherein said mask is opaque overlying one of said metal lines in a bonding pad area wherein said one of said metal lines will form a metal bonding pad and wherein the portion of said negative tone photoresist underlying said clear mask is exposed to said light whereby crosslinks are formed within said exposed photoresist and wherein said portion of said negative tone photoresist underlying said opaque mask is unexposed;

developing said negative tone photoresist wherein said unexposed photoresist is removed leaving said exposed photoresist as an etching mask; and etching away said passivation layer where it is not covered by said etching mask overlying said metal bonding pad wherein said crosslinked photoresist protects said underlying passivation layer in the area of said keyhole from etching damage and wherein said crosslinked photoresist has an erosion rate of 100 Angstroms per minute; and annealing said passivation layer at a temperature of between 400 and 450° C. wherein solvent within said crosslinked photoresist swells thereby preventing said crosslinked photoresist within said keyhole from being extruded from said keyhole during said annealing to complete the fabrication of said integrated circuit device.

2. The method according to claim 1 wherein said semiconductor device structures include gate electrodes and associated source and drain regions and multiple layers of metal lines and intermetal dielectric.

3. The method according to claim 1 wherein said gap between said two of said metal lines is between about 0.7 and 1.0 micron.

4. The method according to claim 1 wherein said step of depositing said passivation layer comprises:

depositing a first conformal layer of silicon oxide overlying said metal lines; and depositing as second layer of silicon nitride overlying said silicon oxide layer.

5. The method according to claim 1 further comprising removing said exposed photoresist after said step of etching away said passivation layer.

6. A method of fabricating an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

depositing a passivation layer overlying said metal lines wherein a keyhole is formed within said passivation layer within said gap;

coating said passivation layer with a negative tone photoresist material wherein said photoresist material flows into said keyhole;

exposing said negative tone photoresist to light through a mask wherein said mask is clear overlying said metal lines in an active area and wherein said mask is opaque overlying a metal line in a bonding pad area where a said metal line will form a bonding pad and wherein the portion of said negative tone photoresist underlying said clear mask is exposed to said light whereby crosslinks are formed within said exposed photoresist and wherein said portion of said negative tone photoresist underlying said opaque mask is unexposed;

developing said negative tone photoresist wherein said unexposed photoresist is removed leaving said exposed photoresist as an etching mask;

etching away said passivation layer where it is not covered by said etching mask where said bonding pad is to be formed wherein said crosslinked photoresist protects said underlying passivation layer in the area of said keyhole from etching damage;

removing said etching mask wherein a portion of said cross-linked photoresist remains within said keyhole;

thereafter annealing said passivation layer wherein solvent within said crosslinked photoresist swells thereby preventing said crosslinked photoresist within said keyhole from being extruded from said keyhole during said annealing; and completing the fabrication of said integrated circuit device.

7. The method according to claim 6 wherein said semiconductor device structures include gate electrodes and associated source and drain regions and multiple layers of metal lines and intermetal dielectric.

8. The method according to claim 6 wherein said gap between said two of said metal lines is between about 0.7 and 1.0 micron.

9. The method according to claim 6 wherein said step of depositing said passivation layer comprises:

depositing a first conformal layer of silicon oxide overlying said metal lines; and depositing as second layer of silicon nitride overlying said silicon oxide layer.

10. The method according to claim 6 wherein said wherein said crosslinked photoresist has an erosion rate of 100 Angstroms per minute.

11. The method according to claim 6 wherein said alloying is performed at a temperature of between about 400 and 450° C.

12. A method of fabricating an integrated circuit device comprising:

providing gate electrodes in and on a semiconductor substrate and forming associated source and drain regions within said semiconductor substrate in an active region;

covering said gate electrodes with a first dielectric layer;

forming electrical connections to said source and drain regions and to said gate electrode by depositing a first metal layer through openings in said first dielectric layer;

forming succeeding levels of intervening dielectric layers and metal layers overlying said first metal layer with appropriate electrical connections wherein said topmost level comprises a dielectric layer;

depositing and patterning a topmost metal layer overlying said topmost dielectric layer to form metal lines wherein there is a gap between two of said metal lines and wherein said topmost metal layer also overlies a bonding pad area and wherein after said patterning, a metal line in said bonding pad area forms a metal bonding pad;

depositing a passivation layer overlying said metal lines wherein a keyhole is formed within said passivation layer within said gap;

coating said passivation layer with a negative tone photoresist material wherein said photoresist material flows into said keyhole;

exposing said negative tone photoresist to light through a mask wherein said mask is clear overlying said metal lines in said active area and wherein said mask is opaque overlying said metal bonding pad area in said bonding pad area and wherein the portion of said negative tone photoresist underlying said clear mask is exposed to said light whereby crosslinks are formed within said exposed photoresist and wherein said portion of said negative tone photoresist underlying said opaque mask is unexposed;

developing said negative tone photoresist wherein said unexposed photoresist is removed leaving said exposed photoresist as an etching mask;

etching away said passivation layer where it is not covered by said etching mask overlying said metal bonding pad wherein said crosslinked photoresist protects said underlying passivation layer in the area of said keyhole from etching damage and wherein said crosslinked photoresist has an erosion rate of 100 Angstroms per minute;

thereafter annealing said passivation layer wherein solvent within said crosslinked photoresist swells thereby preventing said crosslinked photoresist within said keyhole from being extruded from said keyhole during said annealing; and completing the fabrication of said integrated circuit device.

13. The method according to claim 12 wherein said gap between said two of said metal lines is between about 0.7 and 1.0 micron.

14. The method according to claim 12 wherein said step of depositing said passivation layer comprises:

depositing a first conformal layer of silicon oxide overlying said metal lines; and depositing as second layer of silicon nitride overlying said silicon oxide layer.

15. The method according to claim 12 wherein said step of developing said negative tone photoresist material comprises using a tetramethylammoniahydroxide (TMAH)-based developer.

16. The method according to claim 12 wherein said annealing is performed at a temperature of between about 400 and 450° C.

* * * * *